US009024707B1

(12) United States Patent
Park et al.

(10) Patent No.: US 9,024,707 B1
(45) Date of Patent: May 5, 2015

(54) COMPOSITE ELECTRONIC COMPONENT AND BOARD HAVING THE SAME MOUNTED THEREON

(71) Applicant: Samsung Electro-Mechanics Co., Ltd., Suwon-Si, Gyeonggi-Do (KR)

(72) Inventors: Min Cheol Park, Suwon-Si (KR); Heung Kil Park, Suwon-Si (KR)

(73) Assignee: Samsung Electro-Mechanics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 14/260,030

(22) Filed: Apr. 23, 2014

(30) Foreign Application Priority Data

Oct. 24, 2013 (KR) ........................ 10-2013-0127385

(51) Int. Cl.
*H03H 7/00* (2006.01)
*H03H 7/06* (2006.01)

(52) U.S. Cl.
CPC ....................................... *H03H 7/06* (2013.01)

(58) Field of Classification Search
USPC ........... 333/185, 175; 336/200, 206; 29/602.1
See application file for complete search history.

(56) References Cited

U.S. PATENT DOCUMENTS 6,846,693 B2 * 1/2005 Kawase et al. .................. 438/55
8,847,707 B2 * 9/2014 Masuda et al. ................ 333/185
2007/0002513 A1 1/2007 Matsuoka et al.
2008/0116998 A1 * 5/2008 Sekine et al. ................. 333/185
2009/0139757 A1 6/2009 Lee et al.
2011/0309895 A1 * 12/2011 Ahn et al. ..................... 333/185
2013/0093536 A1 * 4/2013 Isoshima ....................... 333/185
2013/0154769 A1 * 6/2013 Masuda ........................ 333/185

FOREIGN PATENT DOCUMENTS

JP 09-129447 A 5/1997
JP 2000-068775 A 3/2000
JP 2004-281893 A 10/2004
JP 2009-135416 A 6/2009
KR 10-2007-0004462 A 1/2007

OTHER PUBLICATIONS

Korean Office Action dated Feb. 1, 2015 issued in Korean Patent Application No. 10-2013-0127385 (English translation).

* cited by examiner

*Primary Examiner* — Quan Tra
(74) *Attorney, Agent, or Firm* — McDermott Will & Emery LLP

(57) ABSTRACT

A composite electronic component may include: a ceramic body including a plurality of dielectric layers, first and second main surfaces opposing each other, first and second side surfaces opposing each other, and first and second end surfaces opposing each other; an inductor part including a first internal electrode disposed in the ceramic body and exposed to the first end surface and second side surface and a second internal electrode disposed in the ceramic body and exposed to the second end surface and second side surface; first and second internal connection conductors disposed in the ceramic body; and first to fourth external electrodes disposed on outer portions of the ceramic body and electrically connected to the first and second internal electrodes and the first and second internal connection conductors. The inductor part and the first and second internal connection conductors may be connected in parallel with each other.

16 Claims, 7 Drawing Sheets

132
100
330
131
330
322
310
300
321
T
W
L

COMPOSITE ELECTRONIC COMPONENT AND BOARD HAVING THE SAME MOUNTED THEREON

CROSS-REFERENCE TO RELATED APPLICATION

This application claims the benefit of Korean Patent Application No. 10-2013-0127385 filed on Oct. 24, 2013, with the Korean Intellectual Property Office, the disclosure of which is incorporated herein by reference.

BACKGROUND

The present disclosure relates to a composite electronic component and a board having the same mounted thereon.

An inductor, a chip electronic component, is a representative passive element configuring an electronic circuit together with a resistor and a capacitor to remove noise.

Particularly, a chip inductor used in a power line of a power supply circuit of which a rated current is several hundreds of mA to several tens of A is referred to as a power inductor.

Meanwhile, in a power supply device for a central processing unit (CPU) of a computer, or the like, voltage noise due to a rapid change in load current may be generated during a process of supplying low voltage.

In addition, since efficiency of a power supply apparatus has become gradually important, in order to decrease a loss, a faster switching speed has been required.

However, when the switching speed increases, negative offset phenomena such as an increase in electromagnetic interference (EMI) caused thereby may be generated.

In addition, at the time of switching field effect transistors (FET) configuring a direct-current (DC)/DC converter, a ringing phenomenon may be generated due to inductance of wiring and parasitic capacitance of the FET, and this phenomenon may cause damages to peripheral circuits while radiating high frequency noise.

For example, resonance may occur by the inductance of wiring and capacitance of a switch device such as FET, or the like, such that electromagnetic interference may be generated due to the high frequency power.

Particularly, in recent small portable terminals such as smart phones, tablet personal computers (PC), and the like, analog circuits such as power supply circuits, wireless circuits, voice circuits, or the like, are adjacent to each other, thus causing communication error or sound quality deterioration.

Generally, in order to solve the above-mentioned problem, research into a technology of adding a capacitor-resistor (C-R) snubber to the FET has been conducted, but in this method, some of power at the time of switching is consumed in the C-R snubber, such that conversion efficiency of the DC/DC converter may be decreased.

Therefore, research into a technology for suppressing the ringing phenomenon to decrease noise while preventing the conversion efficiency of a DC/DC converter from being deteriorated remains required.

SUMMARY

An aspect of the present disclosure may provide a composite electronic component and a board having the same mounted thereon.

According to some embodiments of the present disclosure, a composite electronic component may include: a ceramic body including a plurality of dielectric layers and having first and second main surfaces opposing each other, first and second side surfaces opposing each other, and first and second end surfaces opposing each other; an inductor part including a first internal electrode disposed in the ceramic body and exposed to the first end surface and the second side surface and a second internal electrode disposed in the ceramic body and exposed to the second end surface and the second side surface; first and second internal connection conductors disposed in the ceramic body; and first to fourth external electrodes disposed on outer portions of the ceramic body and electrically connected to the first and second internal electrodes and the first and second internal connection conductors, wherein the inductor part and the first and second internal connection conductors are connected in parallel with each other.

The first and second external electrodes may be disposed on the first and second end surfaces of the ceramic body opposing each other, and the third and fourth external electrodes may be disposed on the first and second side surfaces of the ceramic body opposing each other.

The first internal connection conductor may be exposed to the first end surface and the first side surface.

The second internal connection conductor may be exposed to the second end surface and the first side surface.

Equivalent series resistance (ESR) of the composite electronic component may be controlled by the first and second internal connection conductors.

ESR of the composite electronic component may be increased in a high frequency region as compared to a low frequency region.

According to some embodiments of the present disclosure, a composite electronic component may include: a ceramic body including a plurality of dielectric layers and having first and second main surfaces opposing each other, first and second side surfaces opposing each other, and first and second end surfaces opposing each other; an inductor part including a first internal electrode disposed in the ceramic body and exposed to the first end surface and first main surface and a second internal electrode disposed in the ceramic body and exposed to the second end surface and first main surface; an internal connection conductor disposed in the ceramic body; and first to fourth external electrodes disposed on outer portions of the ceramic body and electrically connected to the first and second internal electrodes and the internal connection conductor, wherein the inductor part and the internal connection conductor are connected in parallel with each other.

The first and second external electrodes may be disposed on the first and second end surfaces of the ceramic body opposing each other, and the third and fourth external electrodes may be disposed on first and second side surfaces of the ceramic body opposing each other.

The internal connection conductor may be exposed to the first and second end surfaces of the ceramic body.

The third and fourth external electrodes may be disposed on the first main surface of the ceramic body.

ESR of the composite electronic component may be controlled by the internal connection conductor.

ESR of the composite electronic component may be increased in a high frequency region as compared to a low frequency region.

According to some embodiments of the present disclosure, a composite electronic component may include: a ceramic body including a plurality of dielectric layers and having first and second main surfaces opposing each other, first and second side surfaces opposing each other, and first and second end surfaces opposing each other; an inductor part including a first internal electrode disposed in the ceramic body and exposed to the first end surface and first main surface and a second internal electrode disposed in the ceramic body and exposed to the second end surface and first main surface; an internal connection conductor disposed in the ceramic body and exposed the first and second end surfaces; and first to third external electrodes disposed on outer portions of the ceramic body and electrically connected to the first and second internal electrodes and the internal connection conductor, wherein the third external electrode is disposed on the first main surface of the ceramic body, and the inductor part and the internal connection conductor are connected in parallel with each other.

According to some embodiments of the present disclosure, a board having a composite electronic component mounted thereon may include: a circuit board having first and second electrode pads disposed thereon; and the composite electronic component as described above mounted on the circuit board.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

Directions of a hexahedron will be defined to clearly describe exemplary embodiments of the present disclosure. L, W and T shown in the accompanying drawings refer to a length direction, a width direction, and a thickness direction, respectively. Here, the thickness direction may be the same as a stacking direction in which dielectric layers are stacked.

Composite Electronic Component

Figure 1:
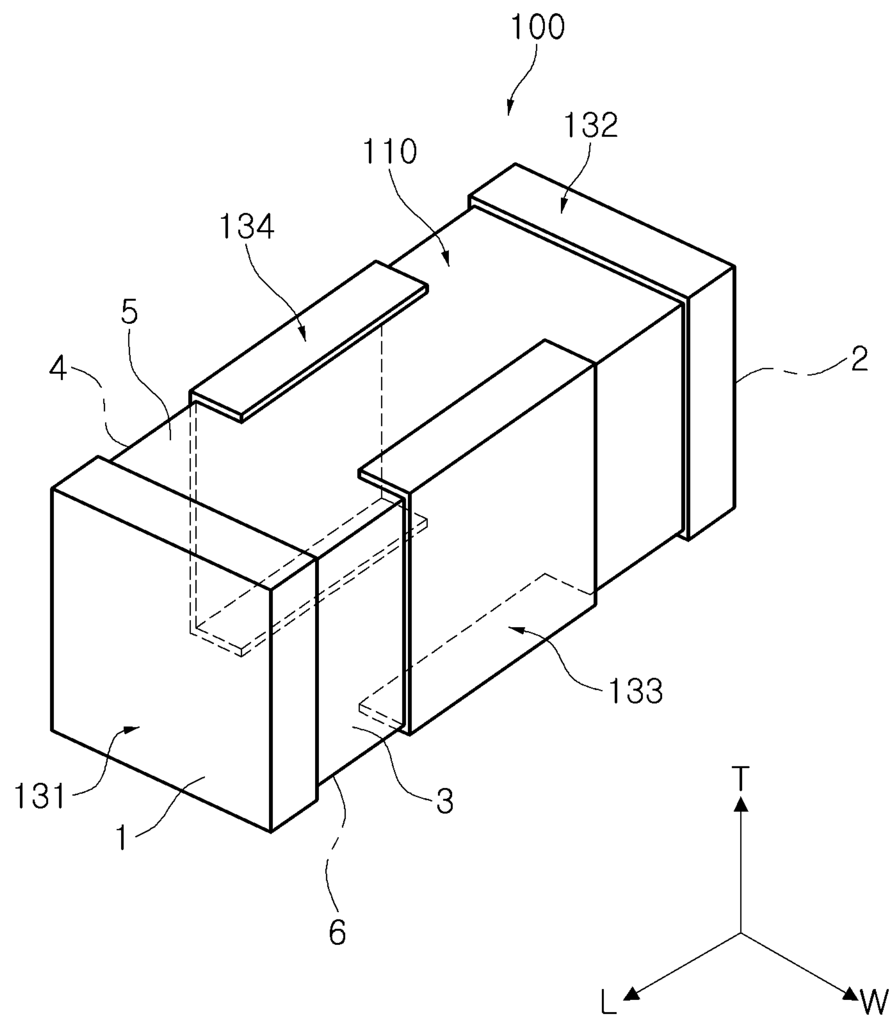
FIG. 1 is a perspective diagram of a composite electronic component according to an exemplary embodiment of the present disclosure.

FIG. 1 is a perspective diagram of a composite electronic component according to an exemplary embodiment of the present disclosure.

Figure 2:
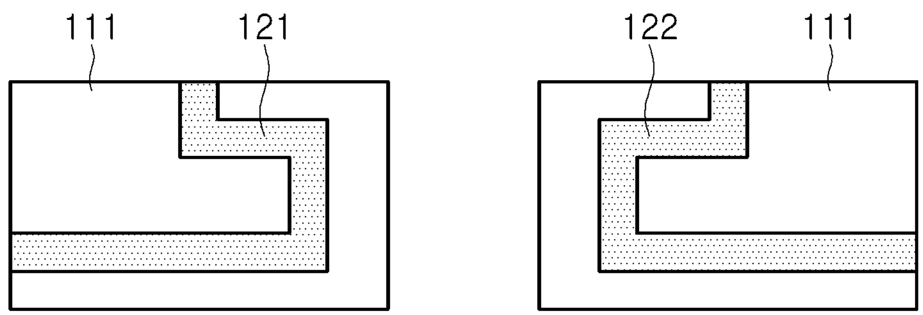
FIG. 2 is a plan diagram illustrating first and second internal electrodes used in the composite electronic component shown in FIG. 1.

FIG. 2 is a plan diagram illustrating first and second internal electrodes used in the composite electronic component shown in FIG. 1.

Figure 3:
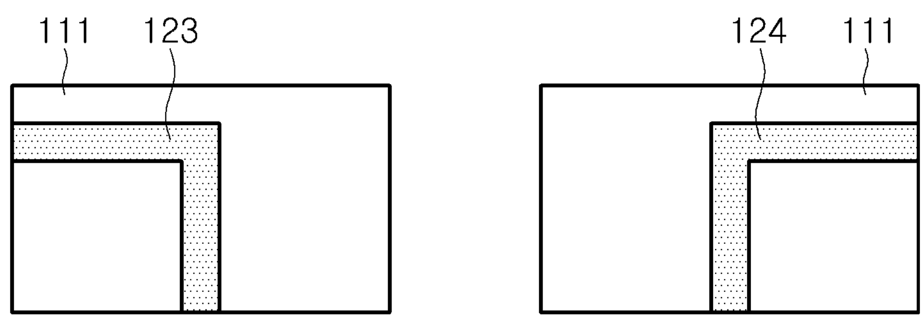
FIG. 3 is a plan diagram illustrating first and second internal connection conductors used together with the first and second internal electrodes shown in FIG. 2.

FIG. 3 is a plan diagram illustrating first and second internal connection conductors used together with the first and second internal electrodes shown in FIG. 2.

Referring to FIGS. 1 through 3, the composite electronic component 100 according to an exemplary embodiment of the present disclosure may include a ceramic body 110 including a plurality of dielectric layers 111 and having first and second main surfaces opposing each other, first and second side surfaces opposing each other, and first and second end surfaces opposing each other.

In this exemplary embodiment, the ceramic body 110 may have first and second main surfaces 5 and 6 opposing each other, and first and second side surfaces 3 and 4 and first and second end surfaces 1 and 2, connecting the first and second main surfaces to each other.

A shape of the ceramic body 110 is not particularly limited, but may be a hexahedral shape as shown in FIG. 1.

The ceramic body 110 may be formed by stacking the plurality of dielectric layers 111, and a plurality of internal electrodes 121 and 122 may be disposed in the ceramic body 110 so as to be separated from each other, having the dielectric layer 111 therebetween.

The plurality of dielectric layers 111 configuring the ceramic body 110 may be in a sintered state and be integrated with each other so as not to discern a boundary between dielectric layers adjacent to each other without using a scanning electron microscope (SEM).

The dielectric layer 111 may be formed by sintering a ceramic green sheet containing a ceramic powder, an organic solvent, and an organic binder. As the ceramic powder, a high k material, a barium titanate (BaTiO3) based material, a strontium titanate (SrTiO3) based material, or the like, may be used. However, the ceramic powder is not limited thereto.

In addition, the dielectric layer 111 may be formed using any material as long as the material may form an inductor L. For example, the dielectric layer 111 may be formed to contain a non-magnetic material.

The non-magnetic metal may be ferrite containing zinc (Zn), copper (Cu), titanium (Ti), or an alloy thereof, but is not limited thereto.

The composite electronic component 100 may include an inductor part including the first internal electrode 121 formed in the ceramic body 110 and exposed to the first end surface 1 and second side surface 4 and the second internal electrode 122 formed in the ceramic body 110 and exposed to the second end surface 2 and the second side surface 4.

An inductor L formed by the first and second internal electrodes 121 and 122 may have inductance of about 1 to 5 nH, but is not particularly limited thereto.

Further, the composite electronic component 100 may include first and second internal connection conductors 123 and 124 formed in the ceramic body 110.

The first and second internal connection conductors 123 and 124 may form a resistor R in the composite electronic component 100.

The resistor R formed by the first and second internal connection conductors 123 and 124 may be controlled to have various resistances according to dimensions or areas of the first and second internal connection conductors 123 and 124 or the number of stacked first and second internal connection conductors 123 and 124.

The resistor R may have resistance of, for example, about 0.1 to 1Ω, but is not limited thereto.

An effective frequency may be controlled by the resistance of the resistor formed by the first and second internal connection conductors 123 and 124, and a ringing phenomenon may be suppressed by an equivalent series resistance (ESR) increased in a high frequency region, such that noise may be decreased.

Further, a loss of inductor L may be decreased by controlling the number of layers of the first and second internal electrodes 121 and 122, such that power loss may be decreased.

The first and second internal electrodes 121 and 122 included in the composite electronic component 100 according to an exemplary embodiment of the present disclosure may be made of a conductive paste containing a conductive metal.

The conductive metal may be nickel (Ni), copper (Cu), palladium (Pd), or an alloy thereof, but is not limited thereto.

The internal electrode may be printed on a ceramic green sheet configuring the dielectric layer using the conductive paste by a printing method such as a screen printing method or a gravure printing method.

The ceramic green sheets having the internal electrode printed thereon may be alternately stacked and sintered, thereby forming the ceramic body.

The first and second internal connection conductors 123 and 124 may be formed of any material as long as the material may form the resistor R. For example, the first and second internal connection conductors 123 and 124 may be made of a conductive paste containing a conductive metal, similarly to the first and second internal electrodes 121 and 122.

The conductive metal may be nickel (Ni), copper (Cu), palladium (Pd), or an alloy thereof, but is not limited thereto.

In addition, the composite electronic component 100 may include first to fourth external electrodes 131 to 134 formed on outer portions of the ceramic body 110 and electrically connecting the first and second internal electrodes 121 and 122 and the first and second internal connection conductors 123 and 124.

The first and second external electrodes 131 and 132 may be disposed on the first and second end surfaces 1 and 2 of the ceramic body 110 opposing each other, and the third and fourth external electrodes 133 and 134 may be disposed on the first and second side surfaces 3 and 4 opposing each other.

According to an exemplary embodiment of the present disclosure, it may be understood that two external electrodes 133 and 134 except for the first and second external electrodes 131 and 132 used as external terminals for connection to a power line are used as external electrodes for controlling ESR.

However, since the first and second external electrodes used as the external terminals may be optionally selected to be appropriate for the ESR characteristics required therein, the first and second external electrodes are not particularly limited.

The first to fourth external electrodes 131 to 134 may be made of a conductive paste containing a conductive metal.

The conductive metal may be nickel (Ni), copper (Cu), tin (Sn), or an alloy thereof, but is not limited thereto.

The conductive paste may further contain an insulating material. The insulating material may be, for example, glass, but is not limited thereto.

A method of forming the first to fourth external electrodes 131 to 134 is not particularly limited. For example, the first to fourth external electrodes 131 to 134 may be formed by dipping the ceramic body or be formed by a plating method, or the like.

The composite electronic component 100 is a four-terminal capacitor having a total of four external electrodes, but the present disclosure is not limited thereto.

Hereinafter, among configurations of the composite electronic component 100 according to an exemplary embodiment of the present disclosure, the first and second internal electrodes 121 and 122, the first and second internal connection conductors 123 and 124, and the external electrodes 131 to 134 will be described in detail.

Referring to FIGS. 2 and 3, the inductor part L may include the first internal electrode 121 exposed to the first end surface 1 and second side surface 4 and the second internal electrode 122 exposed to the second end surface 2 and the second side surface 4 to form inductance.

The inductor part L may be disposed in the ceramic body 110 without particular limitations, and in order to implement a target capacitance value, a plurality of inductor parts may be stacked.

The number of each of the first and second internal electrodes 121 and 122 and the first and second internal connection conductors 123 and 124 is illustrated as one in FIGS. 2 and 3, but actually, the first and second internal electrodes 121 and 122 and the first and second internal connection conductors 123 and 124 may be provided in plural.

Meanwhile, the internal electrodes and the internal connection conductors may be stacked in a sequence shown in FIGS. 2 and 3, but may be stacked in various sequences, as needed.

For example, the first and second internal connection conductors 123 and 124 may be disposed between the inductor parts L.

In an exemplary embodiment of the present disclosure, the first internal connection conductor 123 may be exposed to the first end surface and the first side surface, but is not limited thereto.

Further, in an exemplary embodiment of the present disclosure, the second internal connection conductor 124 may be exposed to the second end surface and the first side surface, but is not limited thereto.

In an exemplary embodiment of the present disclosure, the first internal connection conductor 123 may be exposed to the first end surface 1 and the first side surface 3 and connected to the second internal connection conductor 124 via the third external electrode 133, but is not limited thereto.

Further, the first internal electrode 121 may be exposed to the first end surface 1 and the second side surface 4 and connected to the second internal electrode 122 exposed to the second end surface 2 and the second side surface 4 via the fourth external electrode 134, but is not limited thereto.

In an exemplary embodiment of the present disclosure, the inductor part L formed by the first and second internal electrodes 121 and 122 may be connected in parallel with the resistor R formed by the first and second internal connection conductors 123 and 124.

Pattern shapes of the first and second internal connection conductors 123 and 124 shown in FIG. 3 are only examples according to an exemplary embodiment of the present disclosure, and the first and second internal connection conductors 123 and 124 may have various pattern shapes in order to control the ESR.

For example, the first and second internal connection conductors 123 and 124 may have the same pattern shapes as those of the first and second internal electrodes 121 and 122 as shown in FIG. 2.

According to an exemplary embodiment of the present disclosure, the ESR of the composite electronic component may be controlled by the first and second internal connection conductors 123 and 124.

According to an exemplary embodiment of the present disclosure, the ESR of the composite electronic component may be increased in a high frequency region as compared to a low frequency region.

Therefore, since the ESR in the low frequency region is relatively small, switching current required for power conversion of a DC-DC converter may not be consumed, and a ringing phenomenon may be suppressed by the ESR increased in the high frequency region, thereby decreasing noise.

In addition, the composite electronic composite includes the inductor part L and the first and second internal connection conductors 123 and 124 forming the resistor R, such that resonance may be suppressed and noise may be decreased without an influence on conversion efficiency of the DC-DC converter.

In addition, in this exemplary embodiment of the present disclosure, the first and second external electrodes 131 and 132 may be used as the external terminals for connection with the power line. For example, the first external electrode 131 may be connected to a power terminal, and the second external electrode 132 may be connected to a ground.

Meanwhile, the third and fourth external electrodes 133 and 134, which are two external electrodes except for the first and second external electrodes 131 and 132, may be used as the external electrodes for controlling the ESR and understood as No contact terminals.

Figure 4:
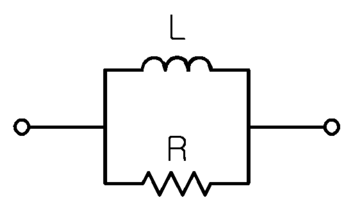
FIG. 4 is an equivalent circuit diagram of the composite electronic component shown in FIG. 1.

FIG. 4 is an equivalent circuit diagram of the composite electronic component shown in FIG. 1.

Referring to FIG. 4, the first and second internal electrodes 121 and 122 forming the inductor part L and the first and second internal connection conductors 123 and 124 forming the resistor R may be connected in parallel with each other.

The composite electronic component according to an exemplary embodiment of the present disclosure has a structure configured of the internal electrodes 121 and 122, the internal connection conductors 123 and 124, and the external electrodes 131 to 134, such that a composite electronic component for the DC-DC converter suppressing resonance may be implemented.

In addition, in the composite electronic component according to an exemplary embodiment of the present disclosure, since the ESR may be decreased in the low frequency region and increased in the high frequency region, the ringing phenomenon may be suppressed by the ESR increased in the high frequency region without consumption of the switching current required for power conversion of the DC-DC converter.

Figure 5:
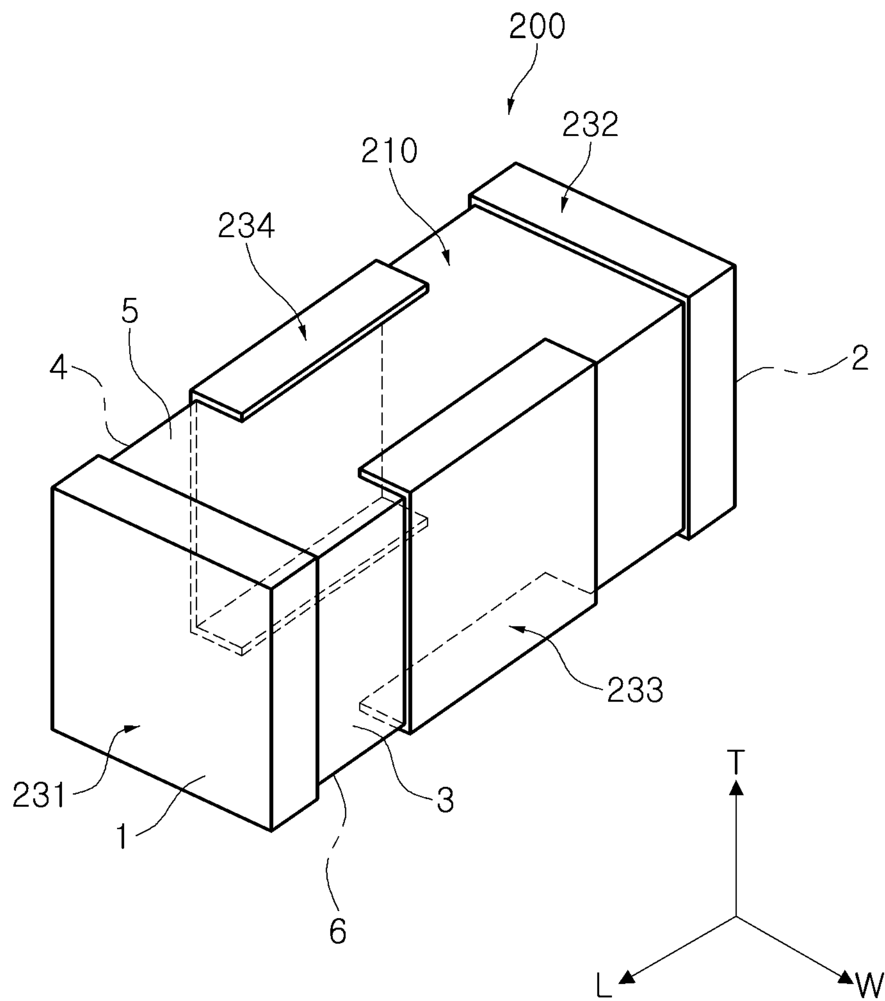
FIG. 5 is a perspective diagram of a composite electronic component according to another exemplary embodiment of the present disclosure.

FIG. 5 is a perspective view of a composite electronic component according to another exemplary embodiment of the present disclosure.

Figure 6:
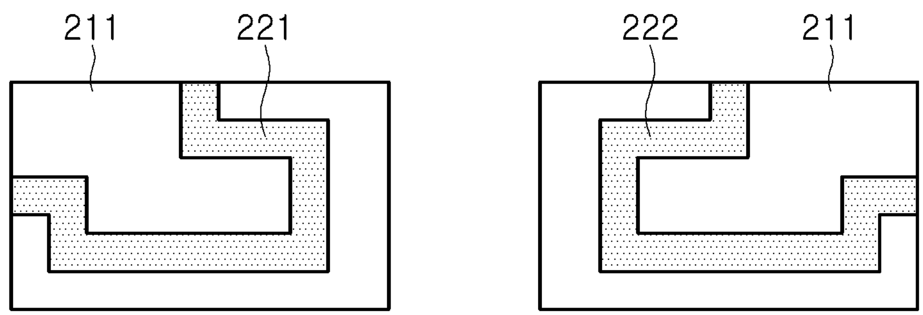
FIG. 6 is a plan diagram illustrating first and second internal electrodes used in the composite electronic component shown in FIG. 5.

FIG. 6 is a plan diagram illustrating first and second internal electrodes used in the composite electronic component shown in FIG. 5.

Figure 7:
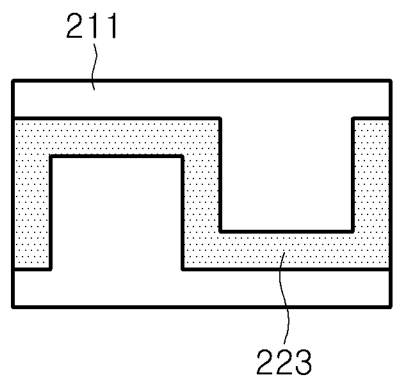
FIG. 7 is a plan diagram illustrating an internal connection conductor used together with the first and second internal electrodes shown in FIG. 6.

FIG. 7 is a plan diagram illustrating an internal connection conductor used together with the first and second internal electrodes shown in FIG. 6.

Referring to FIGS. 5 through 7, a composite electronic component 200 according to another exemplary embodiment of the present disclosure may include a ceramic body 210 including a plurality of dielectric layers 211 and having first and second main surfaces opposing each other, first and second side surfaces opposing each other, and first and second end surfaces opposing each other; an inductor part including a first internal electrode 221 formed in the ceramic body 210 and exposed to the first end surface and the first main surface and a second internal electrode 222 formed in the ceramic body 210 and exposed to the second end surface and the first main surface; an internal connection conductor 223 formed in the ceramic body 210; and first to fourth external electrodes 231 to 234 formed on outer surfaces of the ceramic body and electrically connected to the first and second internal electrodes 221 and 222 and the internal connection conductor 223, wherein the inductor part and the internal connection conductor are connected in parallel with each other.

A description of features of the composite electronic component according to another exemplary embodiment of the present disclosure overlapped with those of the composite electronic component according to the foregoing exemplary embodiment of the present disclosure will be omitted in order to avoid an overlapped description.

The first and second external electrodes 231 and 232 may be disposed on the first and second end surfaces 1 and 2 of the ceramic body 210 opposing each other, and the third and fourth external electrodes 233 and 234 may be disposed on the first and second side surfaces 3 and 4 of the ceramic body 210 opposing each other.

The internal connection conductor 223 may be exposed to the first and second end surfaces 1 and 2 of the ceramic body 210.

The inductor part L may include the first internal electrode 221 exposed to the first end surface 1 and the first main surface 5 and the second internal electrode 222 exposed to the second end surface 2 and the first main surface 5 to form inductance.

In the composite electronic component according to another exemplary embodiment of the present disclosure, one ends of the first and second internal electrodes 221 and 222 may be exposed to the first main surface 5 of the ceramic body 210.

For example, the first and second internal electrodes 221 and 222 and the internal connection conductor 223 of the composite electronic component according to another exemplary embodiment of the present disclosure may be stacked in a direction vertical to a mounting direction at the time of mounting the composite electronic component on a board.

In this case, since the first and second internal electrodes 221 and 222 and the internal connection conductor 223 are stacked in the direction vertical to the mounting direction, stay capacitance between an internal conductor and the board may be relatively small, and high frequency characteristics thereof may be further improved.

In an exemplary embodiment of the present disclosure, the ESR of the composite electronic component may be controlled by the internal connection conductor 223.

The ESR of the composite electronic component may be increased in the high frequency region as compared to the low frequency region.

Figure 8:
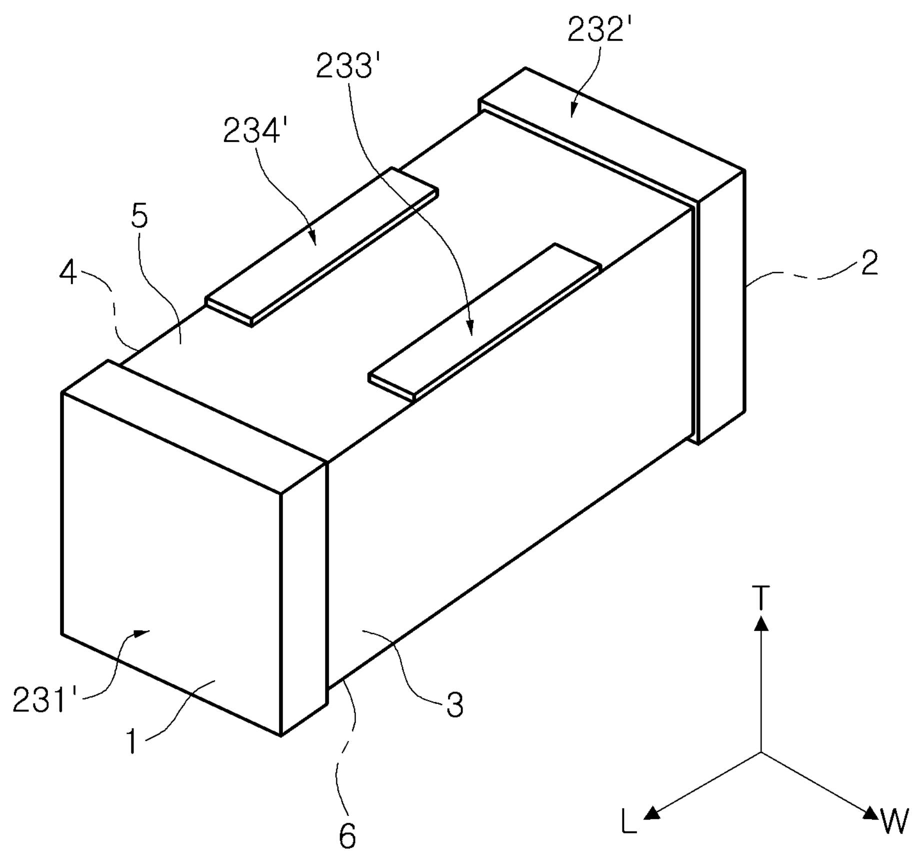
FIG. 8 is a perspective diagram illustrating another example of the composite electronic component shown in FIG. 5.

FIG. 8 is a perspective diagram illustrating another example of the composite electronic component shown in FIG. 5.

Referring to FIG. 8, in the composite electronic component according to another exemplary embodiment of the present disclosure, third and fourth external electrodes 233' and 234' may be disposed on the first main surface 5 of the ceramic body.

Figure 9:
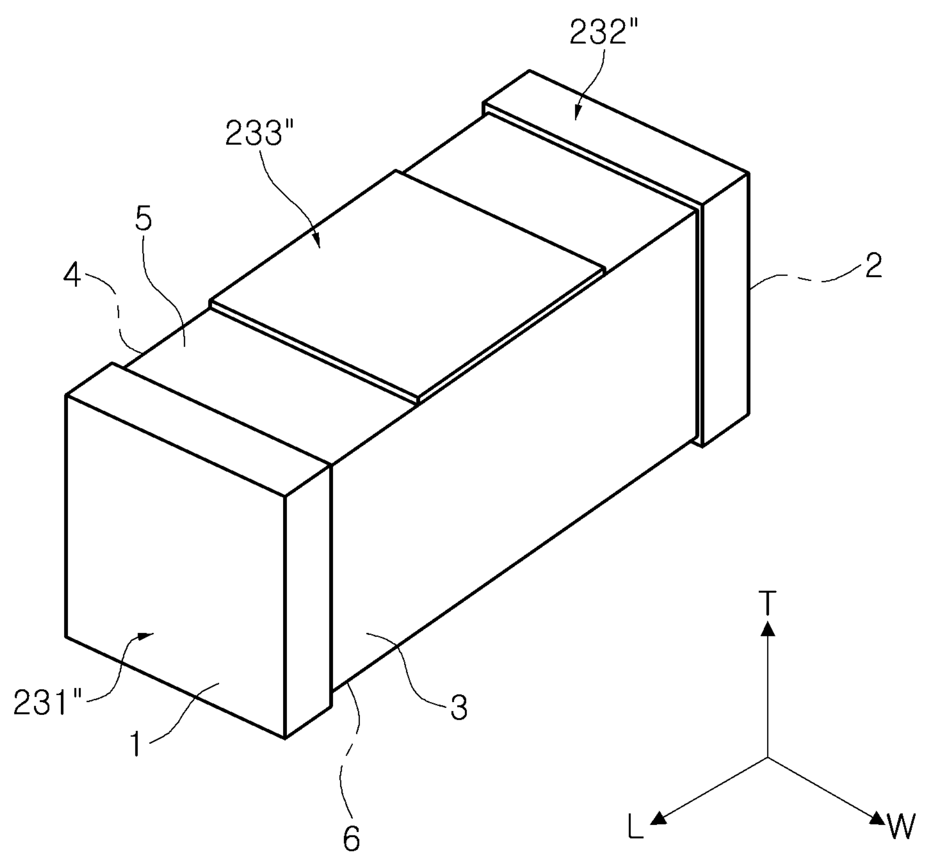
FIG. 9 is a perspective diagram illustrating another example of the composite electronic component shown in FIG. 5.

FIG. 9 is a perspective diagram illustrating another example of the composite electronic component shown in FIG. 5.

Referring to FIG. 9, the composite electronic component according to another exemplary embodiment of the present disclosure may include a ceramic body including a plurality of dielectric layers and having first and second main surfaces opposing each other, first and second side surfaces opposing each other, and first and second end surfaces opposing each other; an inductor part including a first internal electrode formed in the ceramic body and exposed to the first end surface and the first main surface and a second internal electrode formed in the ceramic body and exposed to the second end surface and the first main surface; an internal connection conductor formed in the ceramic body and exposed to the first and second end surfaces; and first to third external electrodes 231" to 233" formed on outer portions of the ceramic body and electrically connected to the first and second internal electrodes and the internal connection conductor, wherein the third external electrode 233" is formed on the first main surface of the ceramic body, and the inductor part and the internal connection conductor are connected in parallel with each other.

Board Having Composite Electronic Component Mounted Thereon

Figure 10:
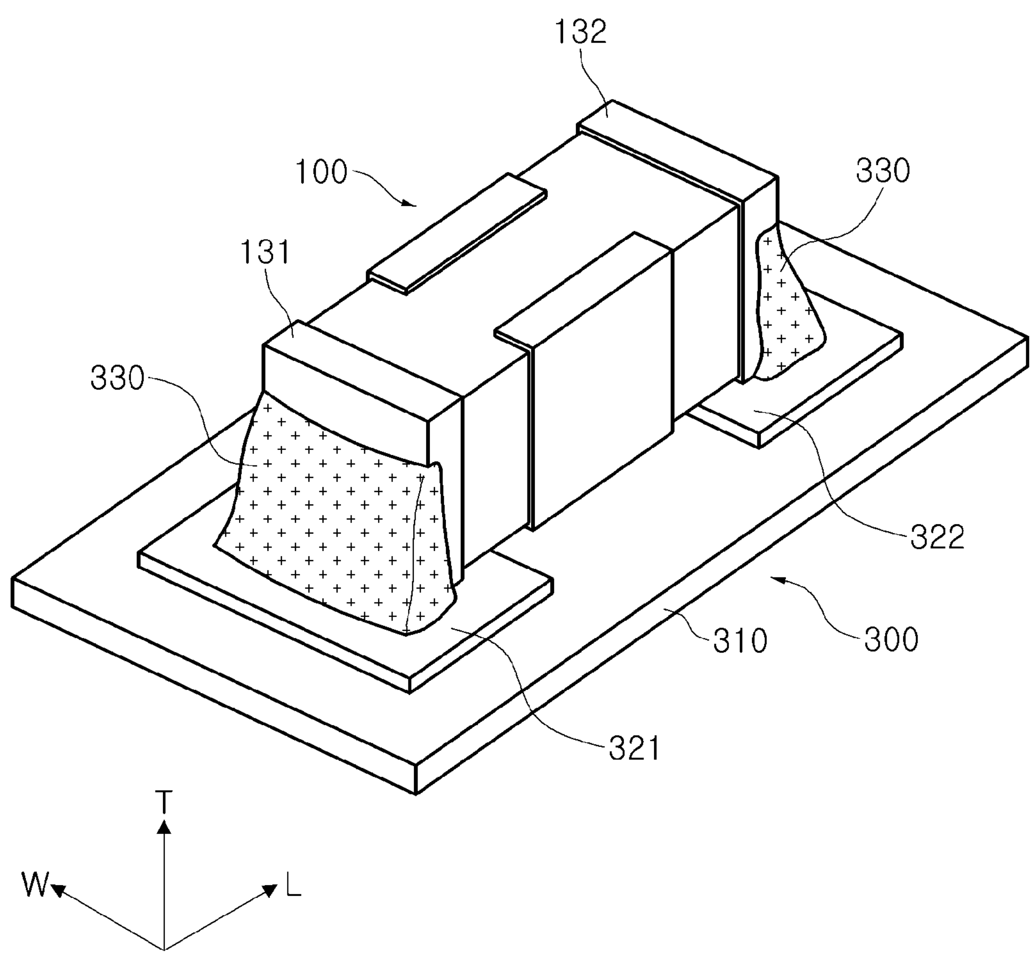
FIG. 10 is a perspective diagram illustrating a form in which the composite electronic component of FIG. 1 is mounted on a circuit board.

FIG. 10 is a perspective diagram illustrating a form in which the composite electronic component of FIG. 1 is mounted on a circuit board.

Referring to FIG. 10, a board 300 having a composite electronic component 100 mounted thereon according to the exemplary embodiment of the present disclosure may include a circuit board on which the composite electronic component 100 is horizontally mounted and first and second electrode pads 321 and 322 formed on the circuit board 310 to be spaced apart from each other.

In this case, the composite electronic component 100 may be electrically connected to the circuit board 310 by a soldering 330 in a state in which first and second external electrodes 131 and 132 are positioned on the first and second electrode pads 321 and 322 so as to contact each other, respectively.

Figure 11:
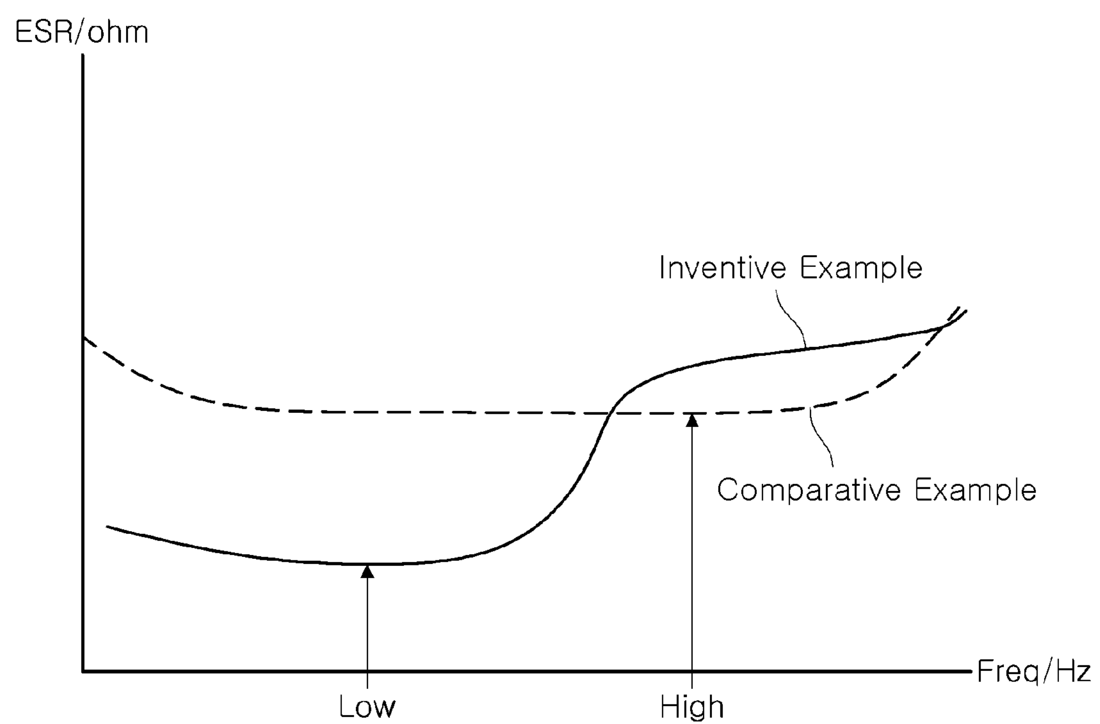
FIG. 11 is a graph for comparing equivalent series resistances (ESR) of Inventive Example and Comparative Example with each other.

FIG. 11 is a graph for comparing equivalent series resistances (ESR) of Inventive Example and Comparative Example with each other.

Referring to FIG. 11, it may be appreciated that in the composite electronic component according to an exemplary embodiment of the present disclosure, since the ESR was relatively small in the low frequency region and was large in the high frequency region as compared to the composite electronic component according to the related art (Comparative Example), a ringing phenomenon may be suppressed by ESR increased in the high frequency region without consumption of the switching current required for power conversion of the DC-DC converter.

According to exemplary embodiments of the present disclosure, the composite electronic component for the DC-DC converter suppressing resonance may be implemented by adding the resistor connected in parallel with the inductor to increase the resistor component in a high frequency band.

Therefore, resonance may be suppressed and noise may be decreased without the influence on conversion efficiency as compared to the structure according to the related art.

In addition, in the composite electronic component according to exemplary embodiments of the present disclosure, since the ESR may be decreased in the low frequency region and may be increased in the high frequency region, the ringing phenomenon may be suppressed by the ESR increased in the high frequency region without consumption of the switching current required for power conversion of the DC-DC converter.

Further, the component may be miniaturized due to the structure, such that the composite electronic component may be used in a relatively high level of current, and the mounting space and costs may be decreased.

While exemplary embodiments have been shown and described above, it will be apparent to those skilled in the art that modifications and variations could be made without departing from the spirit and scope of the present disclosure as defined by the appended claims.

What is claimed is:

1. A composite electronic component comprising:

a ceramic body including a plurality of dielectric layers, first and second main surfaces opposing each other, first and second side surfaces opposing each other, and first and second end surfaces opposing each other;

an inductor part including a first internal electrode disposed in the ceramic body and exposed to the first end surface and the second side surface and a second internal electrode disposed in the ceramic body and exposed to the second end surface and the second side surface;

first and second internal connection conductors disposed in the ceramic body; and first to fourth external electrodes disposed on outer portions of the ceramic body and electrically connected to the first and second internal electrodes and the first and second internal connection conductors, wherein the inductor part and the first and second internal connection conductors are connected in parallel with each other.

2. The composite electronic component of claim 1, wherein the first and second external electrodes are disposed on the first and second end surfaces of the ceramic body opposing each other, and the third and fourth external electrodes are disposed on first and second side surfaces of the ceramic body opposing each other.

3. The composite electronic component of claim 1, wherein the first internal connection conductor is exposed to the first end surface and the first side surface.

4. The composite electronic component of claim 1, wherein the second internal connection conductor is exposed to the second end surface and the first side surface.

5. The composite electronic component of claim 1, wherein equivalent series resistance (ESR) of the composite electronic component is controlled by the first and second internal connection conductors.

6. The composite electronic component of claim 1, wherein ESR of the composite electronic component is increased in a high frequency region as compared to a low frequency region.

7. A composite electronic component comprising:

a ceramic body including a plurality of dielectric layers and having first and second main surfaces opposing each other, first and second side surfaces opposing each other, and first and second end surfaces opposing each other;

an inductor part including a first internal electrode disposed in the ceramic body and exposed to the first end surface and the first main surface and a second internal electrode disposed in the ceramic body and exposed to the second end surface and the first main surface;

an internal connection conductor disposed in the ceramic body; and first to fourth external electrodes disposed on outer portions of the ceramic body and electrically connected to the first and second internal electrodes and the internal connection conductor, wherein the inductor part and the internal connection conductor are connected in parallel with each other.

8. The composite electronic component of claim 7, wherein the first and second external electrodes are disposed on the first and second end surfaces of the ceramic body opposing each other, and the third and fourth external electrodes are disposed on the first and second side surfaces of the ceramic body opposing each other.

9. The composite electronic component of claim 7, wherein the internal connection conductor is exposed to the first and second end surfaces of the ceramic body.

10. The composite electronic component of claim 7, wherein the third and fourth external electrodes are disposed on the first main surface of the ceramic body.

11. The composite electronic component of claim 7, wherein ESR of the composite electronic component is controlled by the internal connection conductor.

12. The composite electronic component of claim 7, wherein ESR of the composite electronic component is increased in a high frequency region as compared to a low frequency region.

13. A composite electronic component comprising:

a ceramic body including a plurality of dielectric layers and having first and second main surfaces opposing each other, first and second side surfaces opposing each other, and first and second end surfaces opposing each other;

an inductor part including a first internal electrode disposed in the ceramic body and exposed to the first end surface and the first main surface and a second internal electrode disposed in the ceramic body and exposed to the second end surface and the first main surface;

an internal connection conductor disposed in the ceramic body and exposed to the first and second end surfaces; and first to third external electrodes disposed on outer portions of the ceramic body and electrically connected to the first and second internal electrodes and the internal connection conductor, wherein the third external electrode is disposed on the first main surface of the ceramic body, and the inductor part and the internal connection conductor are connected in parallel with each other.

14. A board having a composite electronic component mounted thereon, comprising:

a circuit board having first and second electrode pads disposed thereon; and the composite electronic component of claim 1 mounted on the circuit board.

15. A board having a composite electronic component mounted thereon, comprising:

a circuit board having first and second electrode pads disposed thereon; and the composite electronic component of claim 7 mounted on the circuit board.

16. A board having a composite electronic component mounted thereon, comprising:

a circuit board having first and second electrode pads disposed thereon; and the composite electronic component of claim 13 mounted on the circuit board.

* * * * *